(12) United States Patent
Oda et al.

(10) Patent No.: US 7,379,855 B1
(45) Date of Patent: May 27, 2008

(54) METHOD AND APPARATUS FOR TIMING MODELING

(75) Inventors: Shizuka Oda, San Leandro, CA (US); Richard P. Burnley, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 773 days.

(21) Appl. No.: 10/261,420

(22) Filed: Sep. 30, 2002

Related U.S. Application Data

(63) Continuation-in-part of application No. 10/241,496, filed on Sep. 10, 2002, now Pat. No. 7,092,865.

(51) Int. Cl.
*G06F 17/50* (2006.01)
*G06F 17/00* (2006.01)
*G06F 9/45* (2006.01)
*G06F 9/44* (2006.01)
*G06F 9/00* (2006.01)

(52) U.S. Cl. .............................. 703/14; 703/19; 716/2; 716/6; 716/9

(58) Field of Classification Search ................... 703/14, 703/19; 716/2, 6, 9
See application file for complete search history.

(56) References Cited

U.S. PATENT DOCUMENTS

| | | | |
|---|---|---|---|
| 4,758,985 A | 7/1988 | Carter | |
| 4,855,669 A | 8/1989 | Mahoney | |
| 5,072,418 A | 12/1991 | Boutaud et al. | |
| 5,142,625 A | 8/1992 | Nakai | |
| RE34,363 E | 8/1993 | Freeman | |
| 5,274,570 A | 12/1993 | Izumi et al. | |
| 5,311,114 A | 5/1994 | Sambamurthy et al. | |
| 5,339,262 A | 8/1994 | Rostoker et al. | |
| 5,347,181 A | 9/1994 | Ashby et al. | |
| 5,361,373 A | 11/1994 | Gilson | |
| 5,457,410 A | 10/1995 | Ting | |
| 5,473,267 A | 12/1995 | Stansfield | |

(Continued)

FOREIGN PATENT DOCUMENTS

EP 0315275 A2 10/1989

(Continued)

OTHER PUBLICATIONS

Sayfe Kiaei et al., "VLSI Design of Dynamically Reconfigurable Array Processor-Drap," IEEE, Feb. 1989, pp. 2484-2488, V3.6, IEEE, 3 Park Avenue, 17th Floor, New York, NY 10016-5997.

(Continued)

*Primary Examiner*—Kamini Shah
*Assistant Examiner*—Suzanne Lo
(74) *Attorney, Agent, or Firm*—W. Eric Webostad

(57) ABSTRACT

Method and apparatus for timing modeling is described. More particularly, wire information, including wire lengths, is obtained from a routing output. Signals associated with such wire information are classified as input or output signals from an embedded core. Respective templates are automatically selected for the input signals and the output signals, respectively, at least in partial response to the wire lengths. Furthermore, timing information for the embedded core is obtained and classified according to condition, and the input signals and the output signals from the embedded core are determined to obtain rise and fall timing information for such signals.

13 Claims, 6 Drawing Sheets

U.S. PATENT DOCUMENTS

| | | |
|---|---|---|
| 5,500,943 A | 3/1996 | Ho et al. |
| 5,504,738 A | 4/1996 | Sambamurthy et al. |
| 5,537,601 A | 7/1996 | Kimura et al. |
| 5,543,640 A | 8/1996 | Sutherland et al. |
| 5,550,782 A | 8/1996 | Cliff et al. |
| 5,552,722 A | 9/1996 | Kean |
| 5,574,930 A | 11/1996 | Halverson, Jr. et al. |
| 5,574,942 A | 11/1996 | Colwell et al. |
| 5,581,745 A | 12/1996 | Muraoka |
| 5,600,845 A | 2/1997 | Gilson |
| 5,652,904 A | 7/1997 | Trimberger |
| 5,671,355 A | 9/1997 | Collins |
| 5,705,938 A | 1/1998 | Kean |
| 5,732,250 A | 3/1998 | Bates et al. |
| 5,737,631 A | 4/1998 | Trimberger |
| 5,740,404 A | 4/1998 | Baji |
| 5,742,179 A | 4/1998 | Sasaki |
| 5,742,180 A | 4/1998 | DeHon et al. |
| 5,748,979 A | 5/1998 | Trimberger |
| 5,752,035 A | 5/1998 | Trimberger |
| 5,760,607 A | 6/1998 | Leeds et al. |
| 5,809,517 A | 9/1998 | Shimura |
| 5,835,405 A | 11/1998 | Tsui et al. |
| 5,874,834 A | 2/1999 | New |
| 5,889,788 A | 3/1999 | Pressly et al. |
| 5,892,961 A | 4/1999 | Trimberger |
| 5,914,616 A | 6/1999 | Young et al. |
| 5,914,902 A | 6/1999 | Lawrence et al. |
| 5,933,023 A | 8/1999 | Young |
| 5,970,254 A | 10/1999 | Cooke et al. |
| 5,990,702 A * | 11/1999 | Agrawal et al. ............... 326/41 |
| 6,011,407 A | 1/2000 | New |
| 6,020,755 A | 2/2000 | Andrews et al. |
| 6,026,481 A | 2/2000 | New et al. |
| 6,096,091 A | 8/2000 | Hartmann |
| 6,154,051 A | 11/2000 | Nguyen et al. |
| 6,163,166 A | 12/2000 | Bielby et al. |
| 6,172,990 B1 | 1/2001 | Deb et al. |
| 6,178,541 B1 | 1/2001 | Joly et al. |
| 6,181,163 B1 | 1/2001 | Agrawal et al. |
| 6,211,697 B1 | 4/2001 | Lien et al. |
| 6,242,945 B1 | 6/2001 | New |
| 6,272,451 B1 | 8/2001 | Mason et al. |
| 6,279,045 B1 | 8/2001 | Muthujumaraswathy et al. |
| 6,282,627 B1 | 8/2001 | Wong et al. |
| 6,301,696 B1 | 10/2001 | Lien et al. |
| 6,343,207 B1 | 1/2002 | Hessel et al. |
| 6,353,331 B1 | 3/2002 | Shimanek |
| 6,356,987 B1 | 3/2002 | Aulas |
| 6,389,558 B1 | 5/2002 | Herrmann et al. |
| 6,434,735 B1 | 8/2002 | Watkins |
| 6,460,172 B1 | 10/2002 | Insenser Farre et al. |
| 6,467,009 B1 | 10/2002 | Winegarden et al. |
| 6,477,683 B1 * | 11/2002 | Killian et al. .................. 716/1 |
| 6,483,342 B2 | 11/2002 | Britton et al. |
| 6,507,942 B1 | 1/2003 | Calderone et al. |
| 6,510,548 B1 | 1/2003 | Squires |
| 6,518,787 B1 | 2/2003 | Allegrucci et al. |
| 6,519,753 B1 | 2/2003 | Ang |
| 6,522,167 B1 | 2/2003 | Ansari et al. |
| 6,531,888 B2 * | 3/2003 | Abbott ......................... 326/38 |
| 6,532,572 B1 | 3/2003 | Tetelbaum |
| 6,539,508 B1 | 3/2003 | Patrie et al. |
| 6,541,991 B1 | 4/2003 | Hornchek et al. |
| 6,578,174 B2 | 6/2003 | Zizzo |
| 6,587,995 B1 | 7/2003 | Duboc et al. |
| 6,588,006 B1 | 7/2003 | Watkins |
| 6,601,126 B1 * | 7/2003 | Zaidi et al. ................ 710/305 |
| 6,601,227 B1 | 7/2003 | Trimberger |
| 6,604,228 B1 | 8/2003 | Patel et al. |
| 6,611,951 B1 | 8/2003 | Tetelbaum et al. |
| 6,621,298 B2 * | 9/2003 | Agrawal et al. ............... 326/50 |
| 6,640,333 B2 * | 10/2003 | Hamlin ........................ 716/16 |
| 6,678,645 B1 * | 1/2004 | Rajsuman et al. ............ 703/20 |
| 6,680,636 B1 * | 1/2004 | Parry et al. .................. 327/161 |
| 6,700,404 B1 * | 3/2004 | Feng et al. .................... 326/41 |
| 6,934,922 B1 * | 8/2005 | Burnley .......................... 716/6 |
| 7,092,865 B1 * | 8/2006 | Burnley et al. ............... 703/14 |
| 7,254,794 B1 * | 8/2007 | Burnley .......................... 716/6 |
| 2001/0049813 A1 | 12/2001 | Chan et al. |
| 2003/0062922 A1 | 4/2003 | Douglass et al. |

FOREIGN PATENT DOCUMENTS

| | | |
|---|---|---|
| EP | 0 905 906 A2 | 3/1999 |
| EP | 1 235 351 A1 | 8/2002 |
| WO | WO 93 25968 A1 | 12/1993 |

OTHER PUBLICATIONS

Vason P. Srini, "Field Programmable Gate Array (FPGA) Implementation of Digital Systems: an Alternative to ASIC," IEEE, May 1991, pp. 309-314, IEEE, 3 Park Avenue, 17th Floor, New York, NY 10016-5997.

G. Maki et al., "A Reconfigurable Data Path Processor," IEEE, Aug. 1991, pp. 18-4.1 to 18-4.4, IEEE, 3 Park Avenue, 17th Floor, New York, NY 10016-5997.

Jacob Davidson, "FPGA Implementation of Reconfigurable Microprocessor," IEEE, Mar. 1993, pp. 3.2.1-3.2.4, IEEE, 3 Park Avenue, 17th Floor, New York, NY 10016-5997.

Christian Iseli et al., "Beyond Superscaler Using FPGA's," IEEE, Apr. 1993, pp. 486-490, IEEE, 3 Park Avenue, 17th Floor, New York, NY 10016-5997.

P.C. French et al., "A Self-Reconfiguring Processor,"; IEEE, Jul. 1993, pp. 50-59, IEEE, 3 Park Avenue, 17th Floor, New York, NY 10016-5997.

Christian Iseli et al., "Spyder: A Reconfigurable VLIW Processor Using FPGA's," IEEE, Jul. 1993, pp. 17-24, IEEE, 3 Park Avenue, 17th Floor, New York, NY 10016-5997.

Micheal J. Wirthlin et al., "The Nano Processor: A Low Resource Reconfigurable Processor," IEEE, Feb. 1994, pp. 23-30, IEEE, 3 Park Avenue, 17th Floor, New York, NY 10016-5997.

William S. Carter, "The Future of Programmable Logic and Its Impact on Digital System Design," Apr. 1994, IEEE, pp. 10-16, IEEE, 3 Park Avenue, 17th Floor, New York, NY 10016-5997.

Andre' Dehon, "DPGA-Coupled Microprocessors: Commodity ICs for the Early 21st Century,"IEEE, Feb. 1994, pp. 31-39, IEEE, 3 Park Avenue, 17th Floor, New York, NY 10016-5997.

Osama T. Albaharna, " Area & Time Limitations of FPGA-Based Virtual Hardware," IEEE, Apr. 1994, pp. 184-189, IEEE, 3 Park Avenue, 17th Floor, New York, NY 10016-5997.

*Xilinx, Inc.,* "The Programmable Logic Data Book," 1994, Revised 1995, Xilinx, Inc, 2100 Logic Drive, San Jose, CA. 95124.

*Xilinx, Inc.,* "The Programmable Logic Data Book," 1994, Revised 1995, pp. 2-109 to 2-117, Xilinx, Inc., 2100 Logic Drive, San Jose, CA. 95124.

*Xilinx, Inc.,* "The Programmable Logic Data Book," 1994, Revised 1995, pp. 2-9 to 2-18; 2-187 to 2-199, Xilinx, Inc., 2100 Logic Drive, San Jose, CA. 95124.

*Xilinx, Inc.,* "The Programmable Logic Data Book," 1994, Revised 1995, pp. 2-107 to 2-108, Xilinx, Inc., 2100 Logic Drive, San Jose, CA. 95124.

Christian Iseli et al., "AC++ Compiler for FPGA Custom Execution Units Synthesis," 1995, pp. 173-179, IEEE, 3 Park Avenue, 17th Floor, New York, NY 10016-5997.

*International Business Machines,* "PowerPC 405 Embedded Processor Core User Manual," 1996, 5th Ed., pp. 1-1 to X-16, International Business Machines, 1580 Rout 52, Bldg. 504, Hopewell Junction, NY 12533-6531.

Yamin Li et al., "Aizup-A Pipelined Processor Design & Implementation on Xilinx FPGA Chip," IEEE, Sep. 1996, pp. 98-106, 98-106, IEEE, 3 Park Avenue, 17th Floor, New York, NY 10016-5997.

Ralph D. Wittig et al., Onechip: An FPGA Processor with Reconfigurable Logic, Apr. 17, 1996, pp. 126-135, IEEE, 3 Park Avenue, 17th Floor, New York, NY 10016-5997.

*Xilinx, Inc.,* "The Programmable Logic Data Book," Jan. 27, 1999, Ch. 3, pp. 3-1 to 3-50, Xilinx, Inc, 2100 Logic Drive, San Jose, CA 95124.

William B. Andrew et al., "A Field Programmable System Chip Which Combines FPGA & ASIC Circuitry," IEEE, May 16, 1999, pp. 183-186, IEEE, 3 Park Avenue, 17th Floor, New York, NY 10016-5997.

*Xilinx, Inc.,* "The Programmable Logic Data Book," 2000, Ch. 3 pp. 3-1 to 3-117, Xilinx, Inc., 2100 Logic Drive, San Jose, CA 95124.

*Xilinx, Inc.,* "The Programmable Logic Data Book," 2000, Ch. 3, pp. 3-7 to 3-17; 3-76 to 3-87, Xilinx, Inc., 2100 Logic Drive, San Jose, CA. 95124.

*International Business Machines,* "Processor Local Bus" Architecture Specifications, 32-Bit Implementation, Apr. 2000, First Edition, V2.9, pp. 1-76, IBM Corporation, Department H83A, P.O. Box 12195, Research Triangle Park, NC 27709.

*Xilinx, Inc.,* Virtex II Platform FPGA Handbook, Dec. 6, 2000, v1.1, pp. 33-75, Xilinx, Inc., 2100 Logic Drive, San Jose, CA. 95124.

Cary D. Snyder et al., "Xilinx's A-To-Z System Platform," Cahners Microprocessor Report, Feb. 26, 2001, pp. 1-5, Microdesign Resources, www.MDRonline.com, 408-328-3900.

U.S. Appl. No. 09/858,732, filed May 15, 2001, Schulz.
U.S. Appl. No. 09/861,112, filed May 18, 2001, Dao et al.
U.S. Appl. No. 09/917,304, filed Jul. 27, 2001, Douglass et al.
U.S. Appl. No. 09/968,446, filed Sep. 28, 2001, Douglass et al.
U.S. Appl. No. 09/991,410, filed Nov. 16, 2001, Herron et al.
U.S. Appl. No. 09/991,412, filed Nov. 16, 2001, Herron et al.
U.S. Appl. No. 10/001,871, filed Nov. 19, 2001, Douglass et al.
U.S. Appl. No. 10/043,769, filed Jan. 9, 2002, Schulz.

* cited by examiner

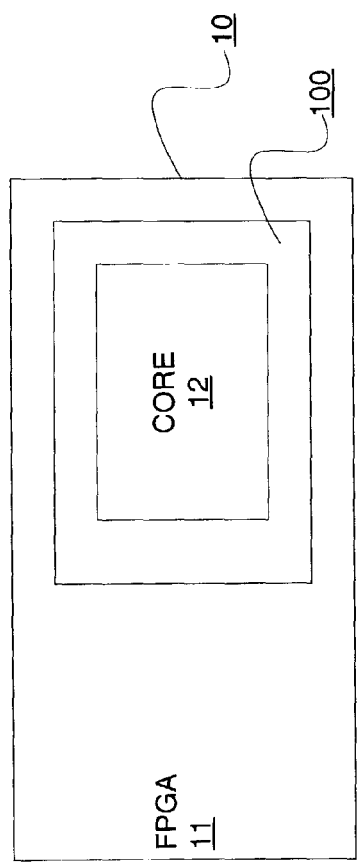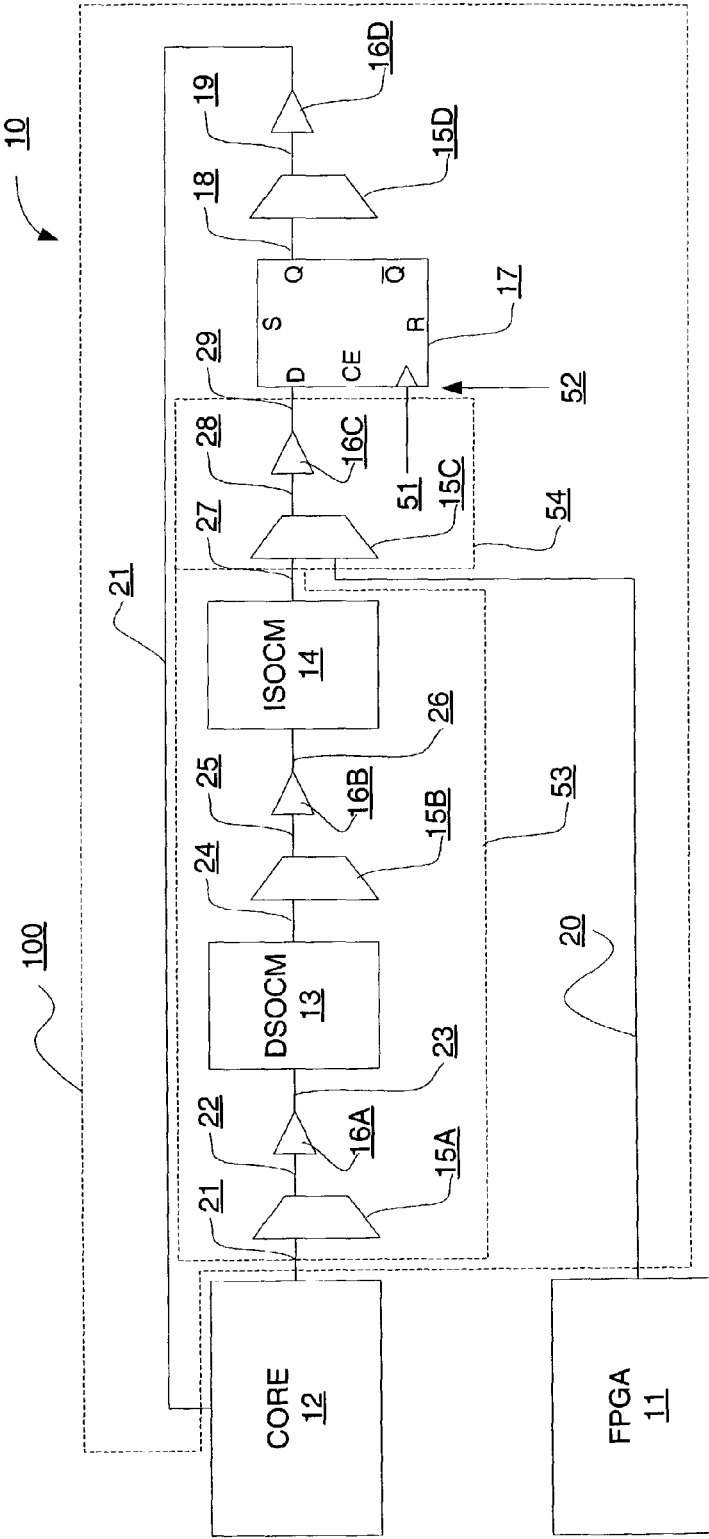
FIG. 1
FIG. 2

METHOD AND APPARATUS FOR TIMING MODELING

FIELD OF THE INVENTION

The present invention relates generally to timing modeling, and more particularly to timing modeling for a gasket module for coupling a core embedded in a programmable logic device.

BACKGROUND OF THE INVENTION

Programmable logic devices exist as a well-known type of integrated circuit that may be programmed by a user to perform specified logic functions. There are different types of programmable logic devices, such as programmable logic arrays (PLAs) and complex programmable logic devices CPLDs). One type of programmable logic devices, called a field programmable gate array (FPGA), is very popular because of a superior combination of capacity, flexibility, time to market and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

The process for producing an integrated circuit comprises many steps. Conventionally, a logic design is followed by a circuit design, which is followed by a layout design. With respect to the circuit design and layout portion, once circuits for an integrated circuit have been designed, such designs are converted to a physical representation known as a "circuit layout" or "layout." Layout is exceptionally important to developing a working design as it affects many aspects, including, but not limited to, signal noise, signal time delay, resistance, cell area, and parasitic effect.

Once a circuit is designed and laid out, it is often simulated to ensure performance criteria are met, including, but not limited to, signal timing. This type of analysis is difficult at the outset, and is made more difficult by an embedded design. An embedded design or embedded circuit is conventionally designed separately from an integrated circuit in which it is embedded. Sometimes this embedded circuit is referred to an intellectual property (IP) core or embedded core. This is because the information to build and test such an embedded circuit is provided from one company to another.

An IP core may have a certain maximum timing performance for input and output. For example, a microprocessor will have certain maximum timing performance for input and output of data and other information. However, there is no de facto standard bus interface for an embedded device. Accordingly, glue or gasket logic and interconnects are used to couple an embedded device to a host device, such as a programmable logic device.

For an embedded core in an integrated circuit, such as an FPGA with an embedded microprocessor core, a portion of the integrated circuit is reserved for the embedded core and gasket/glue logic. In this reserved area, interconnects and gasket logic may be used to couple an embedded core to a host integrated circuit. Moreover, modules from a host integrated circuit may be used for this coupling. However, layout for an embedded device and a host device may be for different layout databases. Thus, understanding where critical time paths are becomes problematic.

Moreover, different layout databases based on different dimensions lead to manual evaluation. However, this was considerably slow and error prone. Furthermore, re-simulation and re-design was slowed by having to manually make changes.

Accordingly, it would be desirable and useful to provide means to automate gathering of gasket timing information from dissimilar layout databases for analysis, and more particularly to provide a self-contained timing model analysis capable of accommodating different layout databases with different process technologies.

SUMMARY OF THE INVENTION

An aspect of the present invention is a method of selecting a simulation template along with automatic extraction of embedded core timing information and gasket wire length and updating contents of the simulation template. A wire length and an associated signal name is obtained. Whether the wire length is for a signal originating from an embedded core in response to the associated signal name is determined. If the wire is for carrying the signal originating from the embedded core, an adjusted wire length is determined. The simulation template is selected in response to whether the adjusted wire length is less than a predetermined length. If, however, the wire is not for carrying the signal originating from the embedded core, then a simulation model for the driver is selected in response to the driving capability chosen by a particular design. Simulation template is selected in response to the driver selected.

Another aspect of the present invention is a method for modeling timing for an integrated circuit having an embedded core. A wire list is obtained from a place and route tool which contains a signal name and associated wire lengths. According to a gasket timing path of interest, embedded core timing information is accessed in response to a condition selected by a user. Signals are classified as one of input signals to an embedded core and output signals from the embedded core. The signals are classified into an input group and an output group. For the output group, output signal path timing information from the embedded core timing information is searched to obtain clock-to-out timing information depending on rising or falling edge of a clock applied at an input of the embedded core, and for the input group, input signal path timing information from the embedded core timing information is searched for setup-hold timing information depending on whether a signal is rising or falling with respect to positive edge clock at the embedded core.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

FIG. 1 is a block diagram of an exemplary embodiment of an integrated circuit in accordance with one or more aspects of the present invention.

FIG. 2 is schematic/block diagram of an exemplary portion of an embodiment of the integrated circuit of FIG. 1.

DETAILED DESCRIPTION OF THE DRAWINGS

Figure 3:
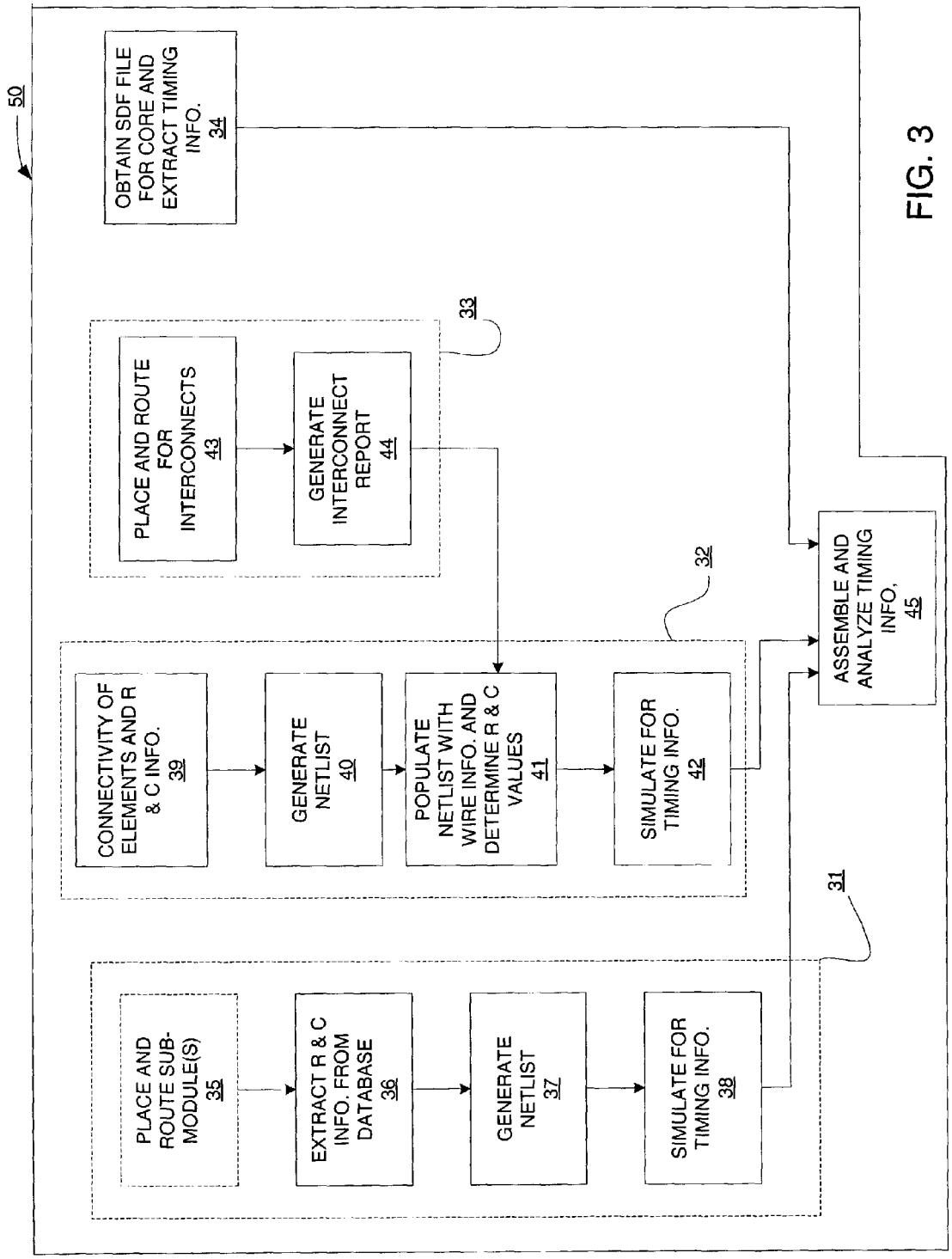
FIG. 3 is a process flow diagram of an exemplary embodiment of a timing modeling process in accordance with one or more aspects of the present invention.

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Referring to FIG. 1, there is shown a block diagram of an exemplary embodiment of an integrated circuit 10 in accordance with one or more aspects of the present invention. Integrated circuit 10 comprises a host device 11, a gasket module 100 and an embedded device 12. Gasket module 100 is for coupling embedded device 12 and host device 11. Examples of embedded device 12 include, but are not limited to, one or more microprocessors, microcontrollers, and digital signal processors, and examples of host device 11 include, but are not limited to, CPLDs, FPGAs and the like. Gasket module 100 comprises interconnects, discrete logic components—including, but not limited to, standard cells. Moreover, gasket module 100 may comprise on-chip memory controllers as sub-modules.

FIG. 2 is schematic/block diagram of an exemplary portion of an embodiment of the integrated circuit of FIG. 1. In order to have an accurate timing model, delays for discrete logic elements, interconnects and sub-modules need to be considered. To do timing analysis, this timing model needs to be able to absorb data timing, including setup times, as well as hold times, clock-to-output times and combinatorial delays.

However, acquiring such timing information for analysis is a non-trivial matter, especially when host device 11 and embedded core 12 are laid out with different databases. Suppose, for example, FPGA 11 has a critical timing signal path from output of FPGA 11 to input of delay flip-flop ("D-FF") 17. D-FF 17 has a clock signal input for clock signal 51, where clock signal 51 is a data clock signal. Rather than slowing clock signal 51, it would be desirable to ensure data arrived at a boundary 52 within a setup time and with enough margin for a hold time for processing such data with D-FF 17.

Thus, delays for interconnects 20, 21, 22, 23, 24, 25, 26, 27, 28 and 29 ("21 through 29") will need to be determined. However, these delays will be subject to physical layout and routing. Additionally, delays for discrete logic, such as for example multiplexers ("MUXs") and buffers 15A, 16A, 15B, 16B, 15C and 16C ("15 and 16") will need to be determined. Additionally, clock-to-output delays and input setup times for sub-modules 13 and 14 will need to be determined. For example, sub-module 13 may be a data-side on-chip memory controller ("DSOCM"), and sub-module 14 may be an instruction-side on-chip memory controller ("ISOCM"). Assuming positive or rising edge clock triggering, clock-to-rising edge and clock-to-falling edge of output may be used as conventions for timing information. Also, it will be assumed that the goal is to not have any latency, namely, to operated D-FF 17 off of single cycles of clock signal 51 for setup and hold times.

From boundary 52 to embedded core 12, clock-to-output delay for D-FF 17 will need to be determined. Additionally, delays for interconnects 18, 19 and 30, MUX 15D, and buffer 16D will have to be determined.

FIG. 3 is a process flow diagram of an exemplary embodiment of a timing modeling process 50 in accordance with one or more aspects of the present invention. Timing modeling process 50 comprises sub-module timing modeling sub-process ("sub-process") 31, gasket logic and interconnect timing modeling sub-process ("sub-process") 32, interconnect timing modeling sub-process ("sub-process") 33, obtain embedded core timing information step 34, and assemble and analyze timing information step 45.

Sub-process 31 is for obtaining timing delays for sub-modules of gasket module 100. In particular, some examples of sub-modules include DSOCM 13 and ISOCM 14, though other sub-modules may be used. At step 35, placement and routing of sub-modules and logic components forming sub-modules is done using a place and route tool. From step 35, a database is generated with sub-module information. Continuing the above example, DSOCM 13 and ISOCM 14 may be part of an FPGA fabric formed using a lithographic dimensional process. Thus, this database will be for such a lithographic dimensional process. For example, a lithographic dimensional process may be a sub-quarter micron process.

A database for host device 11 at one time expressed with a circuit simulation language, is conventionally converted to a physical layout database. This physical layout database may be processed to provide a binary file known as a "GDS" file. A parasitic extraction tool may be used to extract resistance, capacitance and any associated transistor level information ("electrical property information") for sub-modules at step 36. Parasitic extraction programs or tools are well known, and thus unnecessary detail regarding such tools is not provided herein.

In response to obtaining electrical property information for at least one sub-module at step 36, a network list ("netlist") or more particularly a backannotated SPICE netlist, is generated at step 37. A netlist, or more particularly a SPICE netlist, is generated in accordance with conventions and rules for a tool used to process such a netlist. SPICE netlists in particular are well known, and thus unnecessary detail regarding such netlists is not provided herein.

At step 38, timing simulation is done for sub-modules in response to a netlist generated at step 37. In other words, sub-module operation is simulated to obtain sub-module timing information in response to electrical property information obtained for one or more sub-models. This simulation may be done with a device level circuit simulator tool, such as PathMill from Synopsis of Mountain View, Calif., or other known timing analysis simulator.

Sub-module timing information output from step 38 is provided for assembly with other timing information at step 45. Such assembly of information may be broken out into respective paths, namely, to obtain all delays for a path, as described below in more detail for other portions of timing modeling process 50. Information processing and analysis at step 45 may use a spreadsheet, a database and the like.

Referring again to FIG. 2, section or path 53 delays would not be added to path 20 delay, but rather the longer time of the two likely would be used. However, path 54 delay would be added to time from the longer delay as between paths 53 and 20 to determine boundary 52 timing to input of D-FF 17. Thus, core/host-to-signal timing boundary time may be determined, and thus compared with a single clock cycle time of clock signal 51 to see if setup and hold timing is met. For example, if such timing is not met, then one or more of signal paths 20, 53 and 54 may be identified for delay reduction modification.

Again, referring to FIG. 3, sub-process 32 is for obtaining timing delays for at least a portion of gasket logic interconnects of gasket module 100. At step 39, connectivity relationship information between logic elements is obtained. For example, connectivity information for MUXs 15 and buffers 16, or other portion of gasket module 100 may be obtained. Notably, many other well-known types of logic elements may be used. So, for example, with respect to an FPGA, a device control register (DCR) interface and a processor local bus (PLB) interface may be expressed as schematics of gasket logic. In other words, a schematic of DCM function is created for example, from which a netlist may be generated with a captured wire report according to such a schematic.

Whereas, host sub-modules are conventionally accessed from a binary file, namely, a physical layout GDS file, as host device 11 has previously been manufactured without embedded device 12, logic elements and interconnects of a gasket module may not be available as a binary file. In other words, logic and interconnect timing information needs to be generated to determine if an embedded device may be embedded within a desired clock cycle time, and thus integrated circuit 10 is presumed to be in a pre-tapeout stage. Moreover, gasket logic elements, including interconnects and discrete circuit elements, may be for a same or a different lithography than that used for host device 11, even though both may be sub-quarter micron processes. Accordingly, prior to step 39, gasket logic may be captured from a schematic or "database" expressed by a circuit simulation language, such as VHDL, Verilog and the like from which a network list ("netlist") comprising connectivity information for such gasket logic is obtained.

A parasitic extraction tool may be used to extract resistance, capacitance and any associated transistor level information ("electrical property information") for at least a portion of gasket logic and interconnects at step 39. Parasitic extraction programs or tools are well known, and thus unnecessary detail regarding such tools is not provided herein. A wire-line model may be used to model interconnects to obtain resistance and capacitance values. Moreover, a same or different parasitic extraction tool for steps 36 and 39 may be used.

In response to obtaining electrical property information for at least a portion of gasket logic and interconnects at step 39, a netlist for such gasket logic and interconnects is generated at step 40. A netlist is generated in accordance with conventions and rules for a tool used to process such a netlist. Owing to data size, single portions of gasket logic and interconnects may be processed at a time.

Sub-process 33 is for obtaining interconnect lengths for gasket module 100. At step 43, gasket module 100 information, including associated information for core device 12 and host device 11, is provided to a place and route (P&R) program or tool. P&R programs or tools are well known, and thus unnecessary detail regarding such tools is not provided herein. A P&R tool is used to place core integrated circuit 12, sub-modules—such as DSOCM 13 and ISOCM 14, and gasket logic elements—such as D-FF 17, MUXs 15 and buffers 16 in order to route interconnects, such as 18, 19, 20, 21, etc., to and from such placements.

At step 44, an interconnect report is generated in response to output interconnect routing of a P&R tool at step 43. Such an interconnect report comprises lengths for interconnects routed. Moreover, if placement and routing is done with a first lithography; however, actual placement and routing will be done with a second lithography, which is smaller than the first lithography, then a path delay reduction factor may be used. Path delay reduction may be determined in a conventional manner dependent on geometries for the two different lithographies used. Thus, each path length may be effectively reduced using a shrink factor or path length reduction factor.

At step 41, a netlist obtained from step 40 is populated or modified with interconnect information, such as wire lengths, from an interconnect report generated at step 44 in response to interconnects routed at step 43. Continuing the above example of a DCR interface, a netlist is populated with appropriated DCR wire lengths from step 44. These wire lengths are used in combination with electrical property information, capacitance and resistance—including parasitics, from a wire-line model. Wire-line models are well known, and thus are not described herein in unnecessary detail. Such a wire-line model may be part of or separate from a parasitic extraction tool.

At step 42, timing simulation is done for sub-modules in response to a netlist generated at step 40 and modified at step 41. In other words, gasket logic operation and interconnect time delay is simulated to obtain gasket logic and interconnect timing information in response to electrical property information obtained for such gasket logic elements and interconnects. This simulation may be done with a device level circuit simulator tool, such as HSpice or other known device or transistor level simulator.

Gasket logic and interconnect timing delay information output from step 42 is provided for assembly with other timing information at step 45. Such assembly of information may be broken out into respective paths, as described above. Notably, the ability to assemble timing information for an interface, such as PLB, DCR, DSOCM, and ISOCM, among other known interfaces, enables determination of clock-to-output, setup/hold or operating frequency limits for that interface. In this manner, creation of a timing model for an embedded core, such as a processor block, among other forms of possible embedded cores, at a gasket boundary, such as an interface to "FPGA fabric," among other types of circuitry, is facilitated. Additionally, determination of operating frequency capability of a gasket module in connection with operation of an embedded core, for example limitations of processor block to OCM interfaces, is facilitated.

Conventionally, embedded core 12 is provided from one entity to another with performance data, including, but not limited to, setup and hold times and clock-to-output times. This performance information may be provided in a known file format, such as Standard Delay Format (SDF) file(s). According, one or more SDF files for embedded core 12 are obtained at step 34, and timing performance data is extracted from such SDF file(s). Embedded core 12 timing information output from step 34 is provided for assembly with other timing information at step 45. As mentioned above, such assembly of information may be broken out into respective paths, as described above.

Once all delay timing information has been collected for a path, a total delay for such a path may be determined by summing such delays. A total path delay may be added to another total path delay in order to determine a delay from core/host to a signal clock-time boundary. This information may be analyzed to determine whether interconnects should be shortened, or may be lengthened, to meet a desired frequency of operation.

Wireload and Driver Modeling

Figure 4:
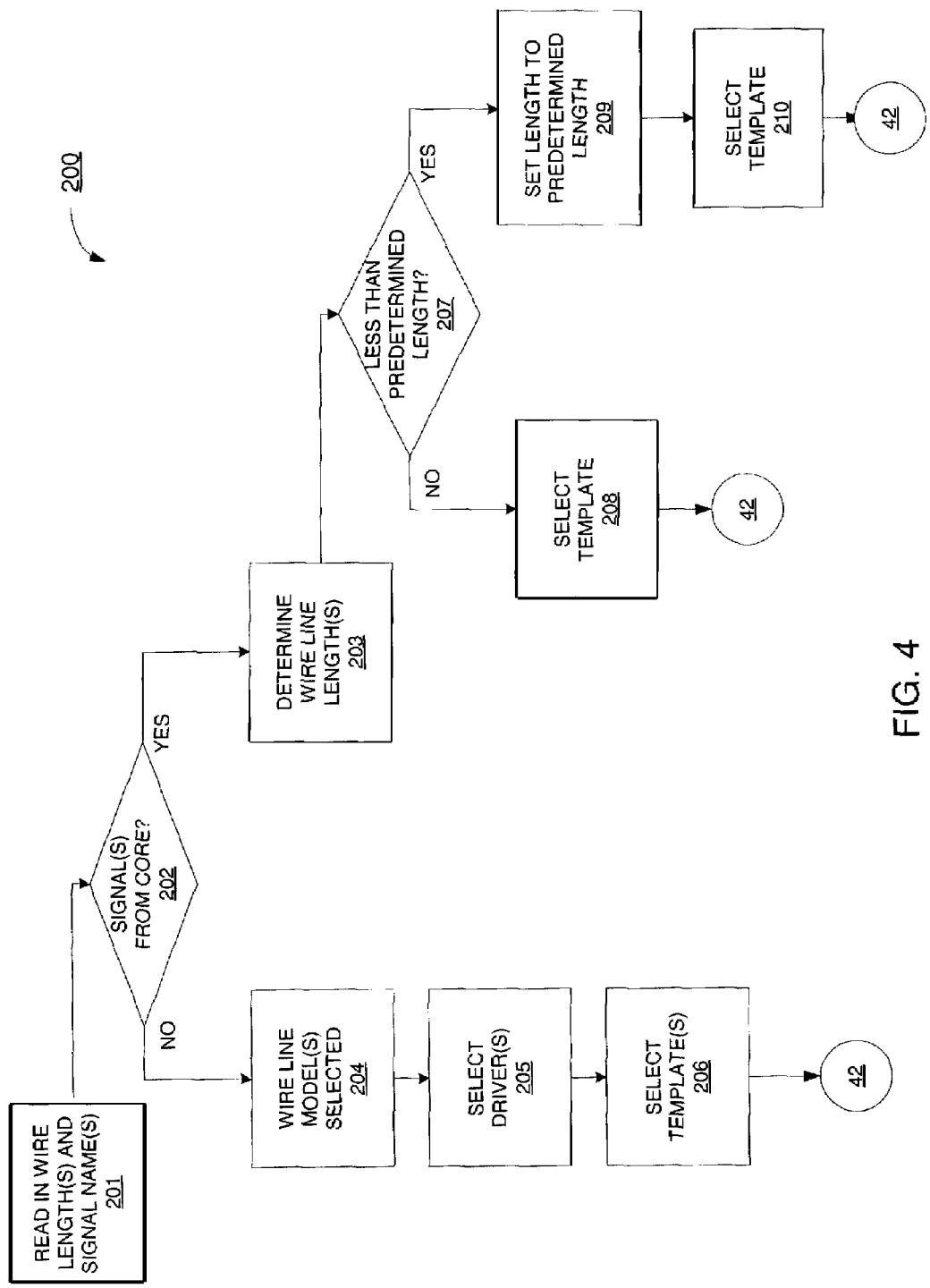
FIG. 4 is a process flow diagram for an exemplary embodiment for a wire length extraction and determination of simulation template process in accordance with one or more aspects of the present invention.

Referring to FIG. 4, there is shown a process flow diagram for an exemplary embodiment for a wire length extraction process 200 in accordance with one or more aspects of the present invention. At step 201, wire length and input/output (I/O) names for gasket logic and connections to and from an embedded core are obtained or otherwise provided to process 200.

At step 202, it is determined for each wire whether it is a signal from an embedded core. Stated another way, for each wire it is determined whether it is to carry communication either from or to an embedded core. Step 202 is to determine which signals from an embedded core need to have a wireload compensation.

If a signal is not from an embedded core, such a signal is provided to an embedded core or gasket logic. Information going to an embedded core may pass through a controller, such as a data or instruction controller, prior to reaching an embedded core.

At step 204, a wire line model is selected for each of such lines for respective wire length. Notably, one model may be used for all conductive lines, or multiple models may be used, as such models may incorporate different physical characteristics, dimensions, material properties and the like, for selected lines corresponding to associated metal layers.

At step 205, a driver is selected according to signal name. A driver may be input by a user, obtained from a lookup table, or otherwise provided.

At step 206, a simulation template netlist ("template") is selected in response to a buffer or driver selected at step 205. Accordingly, it should be appreciated that controllers, such as data and instruction controllers, comprise a plurality of buffers of different sizes. Thus, a simulation template is selected corresponding to a selected buffer. This simulation template may be an HSpice template or other device level simulation tool template. Accordingly, signals originating from other than an embedded core are modeled according to selected driver models.

For signals from an embedded core, at step 203, effective wire length, L, is determined by subtracting from wire length, wl, an amount of wire length, wl', due to capacitive load of a signal from an embedded core. In other words, output pins of an embedded core have an associated capacitance that may be specified. For example, if an output pin of an embedded core is specified as having a 0.25 pico-farad load, this may be converted into an equivalent wire line length dependent on lithographic process. So continuing the example, an equivalent wire line length for a 0.25 pico-farad load may be approximately a 1000 micron wire length for a 0.13 micron (130 nanometers) process. If a gasket module is laid out using a larger lithography, for example a 0.18 micron process interconnect, equivalent wire length is adjusted upwardly, for example to approximately 1500 microns. Actual interconnect delays depend on metal layer dimensions, line spacing and materials, among other well-known factors.

At step 207, a check is made to determine if effective wire length, L, is less than a predetermined number. A clock period associated with signal propagation time is converted to such a predetermine number, namely a wire length. This wire length will then be a maximum wire length allowed for propagation of a signal without slowing clock frequency. For example, if a clock period corresponds to a wire length of 3000 microns, then continuing the above example a check at step 207 would be to determine if L is less than 1500 microns, namely, a maximum wire length minus capacitive load due to an embedded core output pin.

If L is not less than a predetermined number at step 207, in the example L would thus be equal to or greater than 1500 microns, then at step 208 a simulation template is selected in response to L being equal to or greater than such a predetermined number. This simulation template may be an HSpice template or other device level simulation tool template. Notably, conventionally templates are metal layer or conductive level dependent, where different delays may be associated with different metal layers and different lines thereof. Continuing the above example for a 0.25 pf load, if L is greater than or equal to 1500 microns, interconnect delay is too great for a single clock cycle and a more aggressive template may be selected to reduce such a delay for L.

If L is less than a predetermined number at step 207, in the example L would be less than 1500 microns, then at step 209 L is set equal to such a predetermined number.

At step 210, a simulation template is selected in response to L being less than such a predetermined number. Again, this simulation template may be an HSpice template or other device level simulation tool template comprising a wireload model. If L is less than such a predetermined number, then interconnect length is within an acceptable threshold. Accordingly, L may be relaxed by setting it to such a predetermined number, and a template may be selected that is less aggressive with respect to meeting such a delay for L. Output from steps 206, 208 and 210 may be used for a simulation, such as an HSpice simulation at step 42 of FIG. 3 to obtain timing information.

Figure 5:
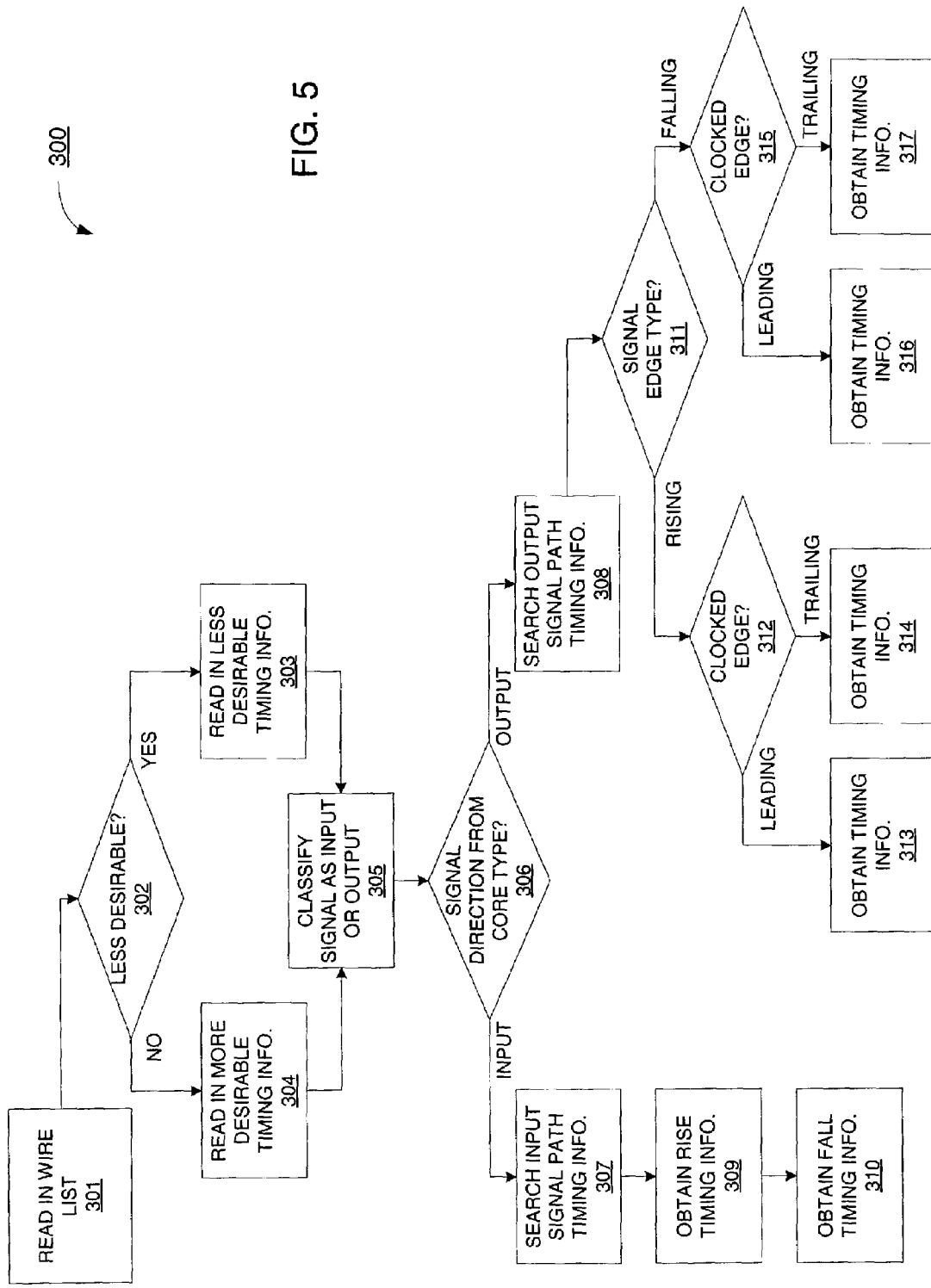
FIG. 5 is a process flow diagram for an exemplary embodiment for an embedded core delay information extraction process in accordance with one or more aspects of the present invention.

Referring to FIG. 5, there is shown a process flow diagram for an exemplary embodiment for a delay information extraction process 300 in accordance with one or more aspects of the present invention. Conventionally, an embedded core is provided from a third party with timing information. This timing information may be provided as a plurality of SDF files, where each file represents different operating and transistor conditions. At step 301, a least one wire list is obtained and read. A wire list in this context is a list of input and output signals of an embedded core.

At step 302, it is determined whether timing information associated with each of such signals is for a "less desirable case" condition. For example, it should be understood that different operating conditions may provide different sets of timing information for a same embedded core. Thus, different operating ranges may be classified into one of two groups, namely, "less desirable case" and "more desirable case." Accordingly, different SDF files may represent different operating conditions. Furthermore, more than two groups may be used. For example, groups may be "best case," "typical case" and "worst case." However, for purposes of clarity, a two group embodiment is described from which extending to more or less than two groups will be apparent.

If at step 302 information is from a "less desirable" condition, then at step 303 "less desirable" timing information is read an from SDF file. However, if at step 302, information is not from a "less desirable" condition, then at step 304 "more desirable" or typical timing information is read from an SDF file.

At step 305, it is determined for each signal or each signal is classified as to whether it is an input signal to an embedded core or an output signal from an embedded core.

At step 306, associations as to input and output are determined. This may be done by checking for one signal type. For example, a check may be made to determine if a signal is an input signal at step 306.

Continuing the above example of checking for input signals at step 306, at step 307 a search is made for an output path signal timing, and at step 308 a search is made for a setup/hold signal timing. Output signals are all associated with clock-to-output timing information, and input signals are all associated with setup, or more particularly setup and hold, timing information. So at step 307, timing information from gasket routing for a signal is obtained for each embedded core output signal, and at step 308, timing information from gasket routing for a signal is obtained for each embedded core input signal.

Particular to SDF files, clock-to-output timing information is stored in separate fields, so step 309 is to obtain rising edge input signal timing information, and step 310 is to obtain falling edge signal input timing information. So, assuming triggering on one side of a clock only, for example from a positive of foremost edge, time to a information having a rising edge and a falling edge may be determined. Though, this description is in terms of single edge triggering for purposes of clarity, double data rate may be used as well.

For embedded core input signals, a check is made at step 311 as to which edge is used for triggering. Again, one type of edge trigger, for example rising or leading edge triggering, may be used to determine which signals are falling edge triggered and which are rising edge triggered. Continuing the above example of checking for rising edge triggered signals at step 311, in response to an input signal being a rising edge triggered signal, at step 312 a check is made to determine what edge of a clock such a signal is used for clocking. Again, one type of edge, for example positive or leading edge, may be used to sort signals into positive and negative, or trailing, edge clocked signals. Continuing the above example of checking for positive edge clocked signals at step 312, at step 313 setup and hold timing information for rising signal edge and rising clock edge input signals are selected from an SDF file, and at step 314 setup and hold timing information for rising signal edge and falling clock edge input signals are selected from an SDF file.

Continuing the above example of checking for rising edge triggered signals at step 311, in response to an input signal being a falling edge triggered signal, at step 315 a check is made to determine what edge of a clock such a signal is used for clocking. Again, one type of edge, for example positive edge, may be used to sort signals into positive and negative clocked signals. Continuing the above example of checking for positive edge clocked signals at step 315, at step 316 setup and hold timing information for falling signal edge and rising clock edge input signals are selected from an SDF file, and at step 317 setup and hold timing information for falling signal edge and falling clock edge input signals are selected from an SDF file.

Accordingly, it should be appreciated that timing information, clock-to-out times, and setup and hold times, reflect transistor conditions and operating conditions, including, but not limited to, voltage and temperature. So though all the signals may look the same, they have different numbers associated with them. Moreover, clock-to-output rise and fall times for output signals are parsed from input signals, and input signals are parsed into four groups.

Furthermore, output from steps 313, 314, 316 and 317 may be provided for assembly of timing information at step 45 of FIG. 3. Accordingly, a spread sheet or database may be used for processing such information.

Figure 6:
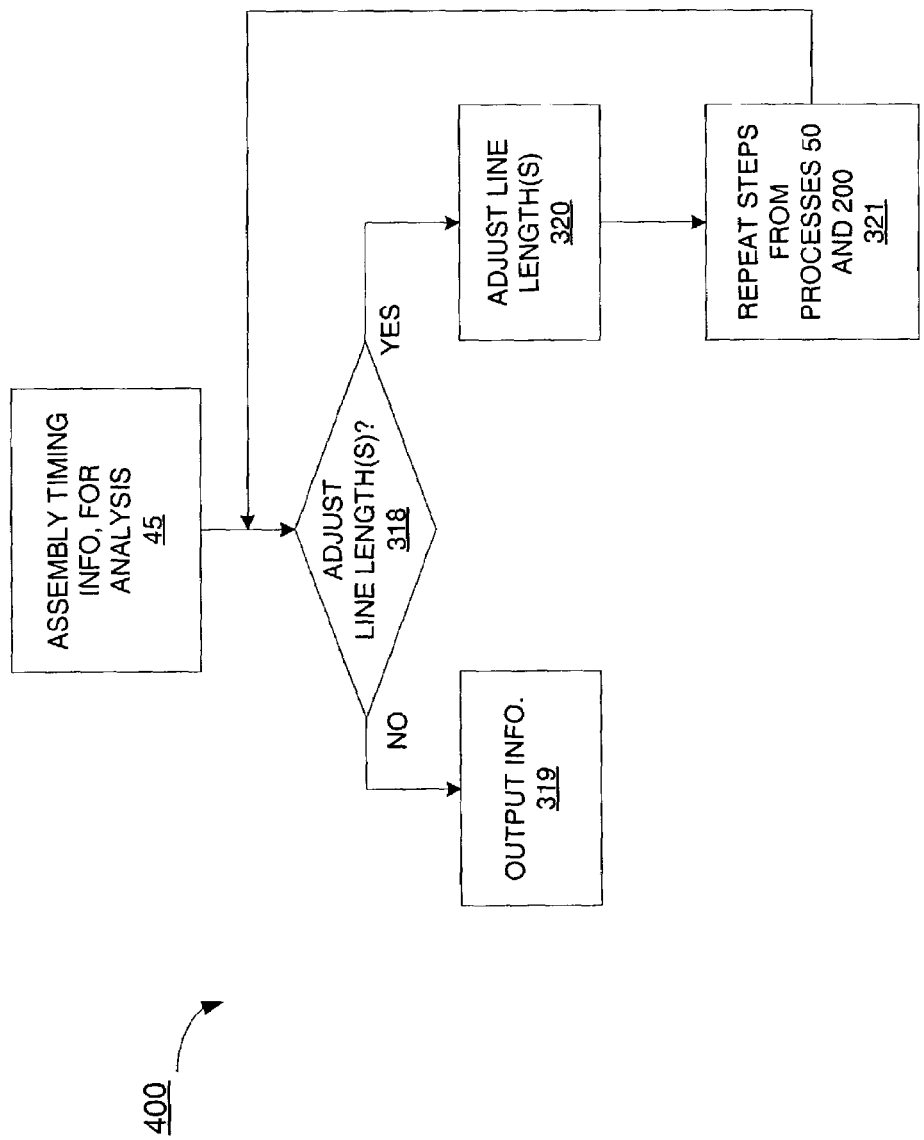
FIG. 6 is a process flow diagram of an exemplary embodiment of a data feedback process in accordance with one or more aspects of the present invention.

Referring to FIG. 6, there is shown a process flow diagram of an exemplary embodiment of a data feedback process 400 in accordance with one or more aspects of the present invention. An initial collection of data is done in accordance with arriving at step 45 of FIG. 3, after which a top or first level timing analysis is done at step 45. This analysis will indicate whether signal propagation for a path is longer or shorter or equal to a defined period of time. This defined period of time may be a single cycle of a clock for an operating frequency. Such an operating frequency may be a highest specified operating frequency for an embedded core.

At step 318, it is determined whether any wire lengths need to be adjusted for a path. In other words, do wires need to be lengthened or shortened to at least meet timing requirements. If no wire lengths need to be adjusted, at step 319, placement, routing and timing information may be outputted. If, however, one or more wire lengths need to be shortened or lengthened or otherwise adjusted, such as by selection of metal layer, then at step 320 such wires are lengthened or shorted to increase or decrease propagation delay, respectively, in response to timing analysis information generated. At step 321, a portion of process 50 may be recalled to repeat steps 42, 44, 41, 42 and 45 to generate revised or re-design data. Moreover, process 200 may be repeated to provide new templates for step 42. In other words, wires are lengthened or shortened resulting in new place and route data output from step 43, which in turn may cause selection of different templates by process 200. Accordingly, new timing information may be output from step 45 for checking for wire length adjustment at step 318 again. This feedback process may continue until timing information is output at step 319 or for a set number of iterations.

Figure 7:
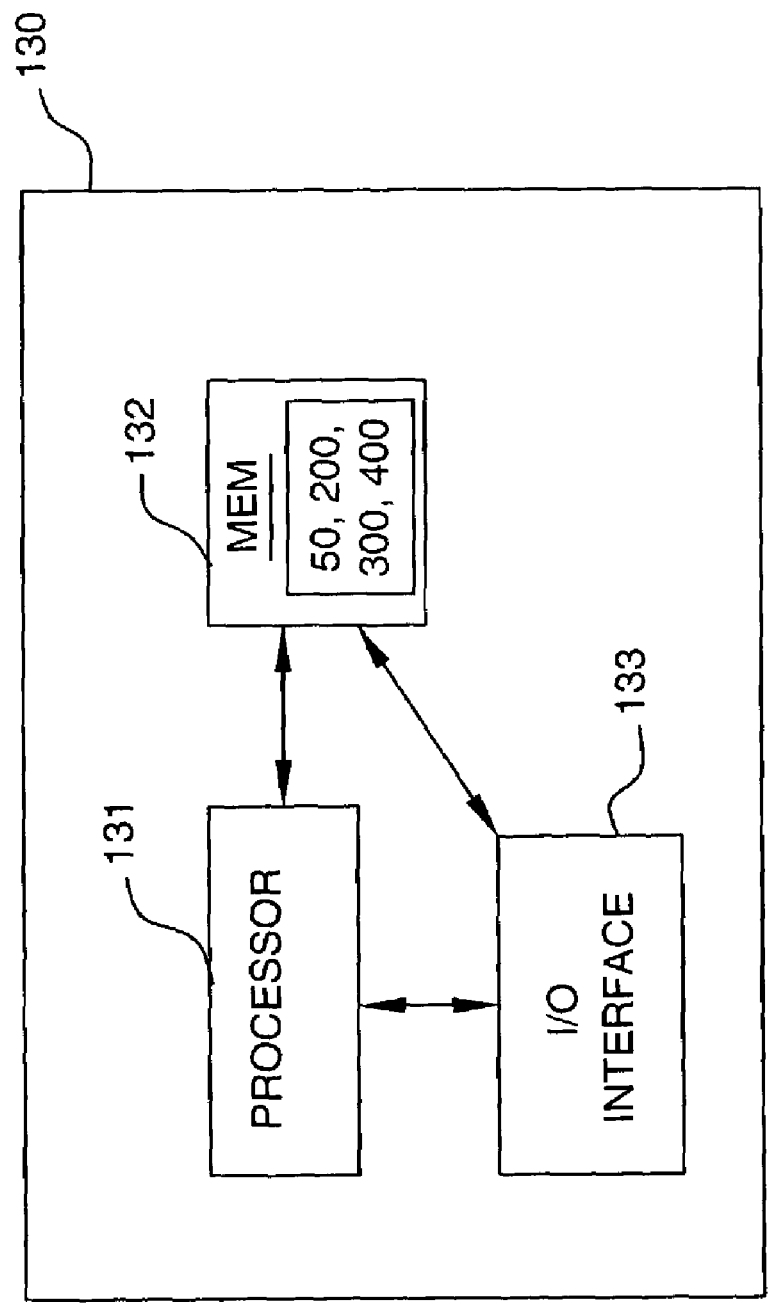
FIG. 7 is a block diagram of a programmed computer system in accordance with one or more aspects of the present invention.

Referring to FIG. 7, there is shown a block diagram of a programmed computer system 130 in accordance with one or more aspects of the present invention. Processor 131 is coupled to memory 132, and I/O interface 133. I/O interface 133 may be coupled to memory 132 as is known for direct memory addressing. Memory 132 may comprise all or a portion of one or more of processes 50, 200, 300 or 400, and one or more associated programs, from time to time.

Embodiments of the present invention may be implemented as program products for use with a computer system 130. The program(s) of the program product defines functions of the embodiments and can be contained on a variety of signal/bearing media, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

Although various embodiments which incorporate the teachings of the present invention have been shown and described in detail herein, those skilled in the art can readily devise many other varied embodiments that still incorporate these teachings. Claims listing steps do not imply any order of the steps unless such order is expressly indicated. All trademarks are the property of their respective owners.

The invention claimed is:

1. A method for selection of a simulation template, comprising:
    obtaining a wire length and an associated signal name;
    determining whether the wire length is for a signal originating from an embedded core in response to the associated signal name, the embedded core being a microprocessor, the embedded core having been designed separately from a host integrated circuit in which the embedded core is embedded;
    if the wire length is not for carrying the signal originating from the embedded core,
        selecting a wire line model for at least one conductive line associated with the wire length;
        selecting a driver in at least partial response to the associated signal name, the associated signal name having signal source information specifying driver type used;
        selecting the simulation template in response to the driver selected, the simulation template being one of a plurality of simulation templates, the simulation template being at the resistor-transistor level;
        iteratively repeating the selecting of the wire line model, the driver, and the simulation template for each of a plurality of drivers in a circuit; and
    simulating operation of the circuit using each said simulation template selected to generate timing information, wherein the circuit is gasket logic for coupling the embedded core to circuitry of the host integrated circuit.

2. The method according to claim 1, wherein the simulation template is a network list.

3. The method according to claim 2, wherein the network list is for an HSpice simulation.

4. A method for selection of a simulation template, comprising:
    obtaining a wire length and an associated signal name;
    determining whether the wire length is for a signal originating from an embedded core in response to the associated signal name, the embedded core being a microprocessor, the embedded core having been designed separately from a host integrated circuit in which the embedded core is embedded;
    if the wire length is for carrying the signal originating from the embedded core,
        determining an adjusted wire length from the wire length;
        determining if the adjusted wire length is less than a predetermined length;
        selecting the simulation template in response to whether the adjusted wire length is less than the predetermined length, the simulation template being at the resistor-transistor level; and
    simulating operation of a circuit using the simulation template to generate timing information, the circuit being gasket logic for coupling the embedded core to circuitry of the host integrated circuit.

5. The method according to claim 4, further comprising setting the adjusted wire length less than the predetermined length to the predetermined length.

6. The method according to claim 4, wherein the step of determining the adjusted wire length comprises subtracting a load wire length from the wire length.

7. The method according to claim 6, wherein the step of subtracting comprises converting a capacitive output load of the embedded core into the load wire length.

8. The method according to claim 4, wherein the predetermined length is determined from a clock period.

9. The method according to claim 8, wherein the clock period is converted into the predetermined length in part by determining signal propagation delay through at least one conductive line.

10. A method for selection of simulation templates, comprising:
    obtaining wire lengths and associated signal names;
    determining whether the wire lengths are for signals originating from an embedded core in response to the associated signal names, the embedded core being a microprocessor, the embedded core having been designed separately from a host integrated circuit in which the embedded core is embedded;
    for the wire lengths not for carrying the signals originating from the embedded core which are for carrying signaling to the embedded core,
        selecting wire line models for conductive lines associated with the wire lengths;
        selecting from a first group of simulation templates;
    for the wire lengths for carrying the signals originating from the embedded core,
        determining adjusted wire lengths from the wire lengths;
        determining if the adjusted wire lengths are less than a predetermined length;
        selecting from a second group of simulation templates in response to a first portion of the adjusted wire lengths being less than the predetermined length;
        selecting from a third group of simulation templates in response to a second portion of the adjusted wire lengths not being less than the predetermined length; and
    simulating operation of a circuit using the simulation templates selected from the first group of simulation templates, the second group of simulation templates, and the third group of simulation templates to generate timing information, the circuit being gasket logic for coupling the embedded core to circuitry of the host integrated circuit, and the simulation templates selected being at the resistor-transistor level.

11. The method according to claim 10, wherein the first group of simulation templates, the second group of simulation templates and the third group of simulation templates each comprise at least one network list.

12. The method according to claim 11, wherein the at least one network list is for HSpice simulation.

13. A tangible computer-readable storage medium having stored thereon computer-executable instructions for performing a method of selecting simulation templates, the method comprising steps of:

accessing a wire length and an associated signal name;

determining whether the wire length is for a signal originating from an embedded core in response to the associated signal name, the embedded core being a microprocessor, the embedded core having been designed separately from a host integrated circuit in which the embedded core is embedded;

if the wire length is not for carrying the signal originating from the embedded core, a. selecting a wire line model for at least one conductive line associated with the wire length;

b. selecting a driver in at least partial response to the associated signal name, the associated signal name having signal source information specifying driver type used;

c. selecting a first simulation template in response to the driver selected; if the wire length is for carrying the signal originating from the embedded core, d. determining an adjusted wire length from the wire length;

e. determining if the adjusted wire length is less than a predetermined length;

f. selecting a second simulation template in response to whether the adjusted wire length is less than the predetermined length;

simulating operation of a circuit using the first simulation template selected and the second simulation template selected to generate timing information;

iteratively repeating steps a, b, and c for selection of a plurality of first simulation templates responsive to a plurality of drivers in the circuit, the plurality of drivers including the driver;

iteratively repeating steps d, e, and f for selection of a plurality of second simulation templates responsive to a plurality of wire lengths in the circuit, the plurality of wire lengths including the wire length; and the simulated operation of the circuit being responsive to the plurality of first simulation templates selected and the plurality of second simulation templates selected, the circuit being gasket logic for coupling the embedded core to circuitry of the host integrated circuit, and the first plurality of simulation templates and the second plurality of simulation templates selected being at the resistor-transistor level.

* * * * *